United States Patent
Shin

(10) Patent No.: US 7,329,572 B2
(45) Date of Patent: Feb. 12, 2008

(54) METHOD OF FORMING PIP CAPACITOR

(75) Inventor: Young Wook Shin, Seoul (KR)

(73) Assignee: Dongbu Hitek Co., Ltd., Seoul (KR)

(*) Notice: Subject to any disclaimer, the term of this patent is extended or adjusted under 35 U.S.C. 154(b) by 0 days.

(21) Appl. No.: 11/616,261

(22) Filed: Dec. 26, 2006

(65) Prior Publication Data

US 2007/0148856 A1   Jun. 28, 2007

(30) Foreign Application Priority Data

Dec. 28, 2005  (KR)  ............ 10-2005-0131526

(51) Int. Cl.
  *H01L 21/8234* (2006.01)
  *H01L 21/8244* (2006.01)
  *H01L 21/8242* (2006.01)
  *H01L 21/20* (2006.01)

(52) U.S. Cl. .............. 438/238; 438/239; 438/253; 438/446; 438/397; 438/399; 438/250; 257/E21.008; 257/E21.011

(58) Field of Classification Search ........ 438/238, 438/239, 250, 253, 397, 399, 446; 257/E21.008, 257/E21.011

See application file for complete search history.

(56) References Cited

U.S. PATENT DOCUMENTS

| | | | | |
|---|---|---|---|---|
| 5,195,017 | A | * | 3/1993 | McDonald .......... 361/313 |
| 5,918,119 | A | * | 6/1999 | Huang .............. 438/238 |
| 6,207,495 | B1 | * | 3/2001 | Choi ................ 438/250 |
| 2005/0124133 | A1 | * | 6/2005 | Tu .................. 438/397 |

* cited by examiner

*Primary Examiner*—Michael Lebentritt
*Assistant Examiner*—Mohsen Ahmadi
(74) *Attorney, Agent, or Firm*—Sherr & Nourse, PLLC

(57) ABSTRACT

A method of forming a polysilicon-insulator-polysilicon (PIP) capacitor includes the steps of forming a lower electrode of a first polysilicon layer over a semiconductor substrate, forming a dielectric layer over the lower electrode, forming a second polysilicon layer over the dielectric layer, patterning the second polysilicon layer, implanting impurities into a side wall of the patterns of the second polysilicon layer and selectively etching the side wall of the patterns of the second polysilicon layer. The impurities are implanted to control an effective line width of the patterns of the second polysilicon layer as an upper electrode.

9 Claims, 2 Drawing Sheets

METHOD OF FORMING PIP CAPACITOR

The present application claims priority under 35 U.S.C. 119 and 35 U.S.C. 365 to Korean Patent Application No. 10-2005-0131526 (filed on Dec. 28, 2005), which is hereby incorporated by reference in its entirety.

BACKGROUND

As semiconductor devices become smaller and lighter, more and more functions are integrated onto a single chip. Most semiconductor devices incorporate capacitors. A polysilicon-insulator-polysilicon (PIP) capacitor obtained by having a thin dielectric layer interposed between polysilicon layers may be incorporated into an analog semiconductor device. The method of manufacture of a PIP capacitor is advantageous for such purposes.

However, incorporating multiple polysilicon layers in a semiconductor logic device is extremely difficult. The characteristics of a PIP capacitor are significantly affected by process conditions. In fact, the capacitance may vary significantly with a small change in the size, and/or in the resistance of the polysilicon layer.

FIG. 1 is a sectional view schematically illustrating a method of forming a PIP capacitor.

Referring to FIG. 1, a first polysilicon layer 21 used as the gate of a transistor is formed over a semiconductor substrate 10. Then, after rendering a portion of the layer conductive using $PCl_3$ and forming a tungsten silicide layer ($WSi_x$) 23, an anti-reflection coating layer (ARC) 25, made up of a TiN layer, is formed. Then, an additional polysilicon layer 27 is formed over the anti-reflection coating layer 25. The additional polysilicon layer 27 can actually be understood as a lower electrode of the PIP capacitor, and may function as a terminal, being an underlayer of the capacitor.

Thus, while a gate is formed within a cell region, the lower electrode 20 of the PIP capacitor is formed in a peripheral circuit region.

An oxide layer is formed to function as dielectric layer 30 of the PIP capacitor. A second polysilicon layer 40 is formed over the dielectric layer 30. Afterwards, the second polysilicon layer 40 is etched using a patterning mask, thereby forming an upper electrode. Then, after forming an interlayer insulating layer 50, a first contact 51 is formed in the interlayer insulating layer 50 to connect to the second polysilicon layer 40 and a second contact 53 is formed to connect to the lower electrode 20. In this manner, a PIP capacitor may be formed using polysilicon layers to sandwich an insulating layer.

SUMMARY

Embodiments relate to a semiconductor device, and more particularly, to a method of forming a polysilicon-insulator-polysilicon (PIP) capacitor.

Embodiments relate to a method of forming a polysilicon-insulator-polysilicon (PIP) capacitor capable of controlling deviations in unit capacitance due to a minute change in the design of the capacitor using process parameters.

Embodiments relate to a method of forming a polysilicon-insulator-polysilicon (PIP) capacitor. The method includes the steps of forming a lower electrode of a first polysilicon layer over a semiconductor substrate; forming a dielectric layer over the lower electrode; forming a second polysilicon layer over the dielectric layer; patterning the second polysilicon layer; implanting impurities into a side wall of the patterns of the second polysilicon layer; and selectively etching the side wall of the patterns of the second polysilicon layer wherein the impurities are implanted to control an effective line width of the patterns on the second polysilicon layer which functions as an upper electrode.

The first polysilicon layer is formed simultaneously with the gate of a transistor, which formed over the same substrate as the PIP. The first polysilicon layer uses material deposited in the same layer as the gate of the transistor. The method may further include the steps of forming a tungsten silicide layer over the first polysilicon layer and forming an additional polysilicon layer over the tungsten silicide layer.

The additional polysilicon layer may be about half of the thickness of the second polysilicon layer and may function as an anti-reflection coating layer.

The step of implanting the impurities may be selectively performed using the same mask used for the step of patterning the second polysilicon layer.

The effective line width of the patterns of the second polysilicon layer may be varied depending on the inclination angle at which the impurities are implanted.

BRIEF DESCRIPTION OF THE DRAWINGS

Example

DETAILED DESCRIPTION

Figure 1:
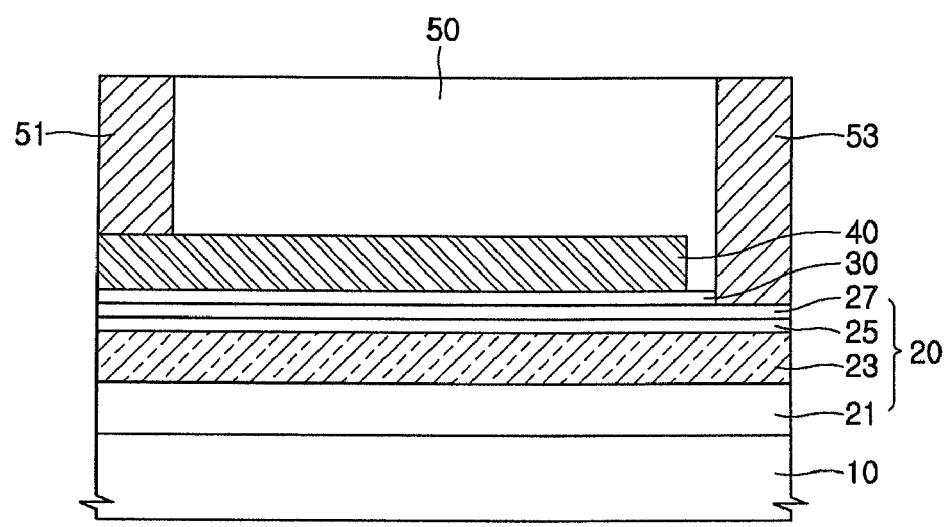
FIG. 1 is a sectional view schematically illustrating a method of forming a PIP capacitor.
Figure 2:
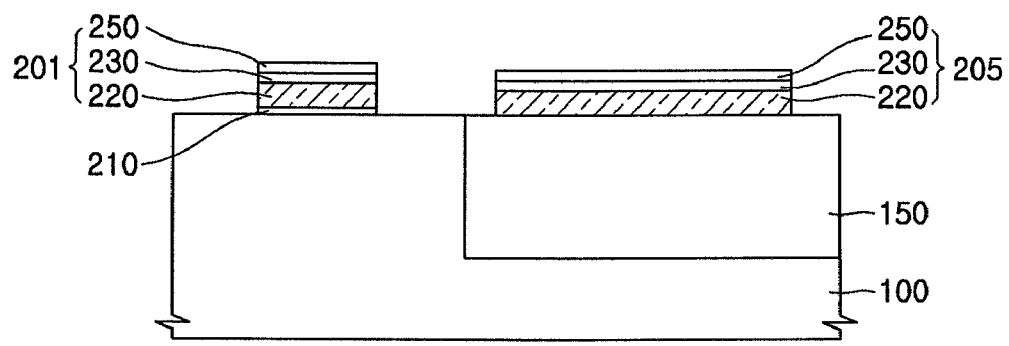
FIGS. 2 to 4 are sectional views schematically illustrating a method of forming a PIP capacitor according to embodiments.

Referring to FIG. 2, a method of forming a capacitor may be employed as a cooperating part of the process of forming highly integrated semiconductor CMOS field effect transistors (CMOSFET) for analog circuits. First, a device isolation insulating layer 150 for isolating the transistors can be formed using a shallow trench isolation (STI) method or a local oxidation of silicon (LOCOS) method. A p-well or/and an n-well is formed. Then, a gate oxide layer 210 is formed over the semiconductor substrate 100.

After forming a first polysilicon layer 220 for a gate over the gate oxide layer 210, rendering the layer conductive by means of $PCl_3$, and forming a tungsten silicide ($WSi_x$) layer 230, an additional polysilicon layer 250 is formed. The additional polysilicon layer 250 functions as the lower electrode of the PIP capacitor, and it may additionally function as an anti-reflection coating (ARC) layer. The anti-reflection coating layer reduces reflectance in a gate exposing process using stepper exposure equipment, thereby allowing a more precise exposure.

The additional polysilicon layer 250 may be about half the thickness of a second polysilicon layer 400 (see FIG. 3) for the upper electrode. Since the upper electrode is formed of the second polysilicon layer, the lower electrode may be formed of a polysilicon layer having the same property. Also, a highly efficient capacitor can be formed when the resistance of the second polysilicon layer and the resistance of the additional polysilicon layer 250 are identical. Note that the lower conductive layer 205 comprises layers 220 and 230, increasing the overall thickness of the conductive lower layer beyond the thickness of layer 250 alone.

Then, the polysilicon layer 250 is patterned using a gate mask to simultaneously form a gate pattern 201 and a lower electrode pattern 205 for the PIP capacitor.

Figure 3:
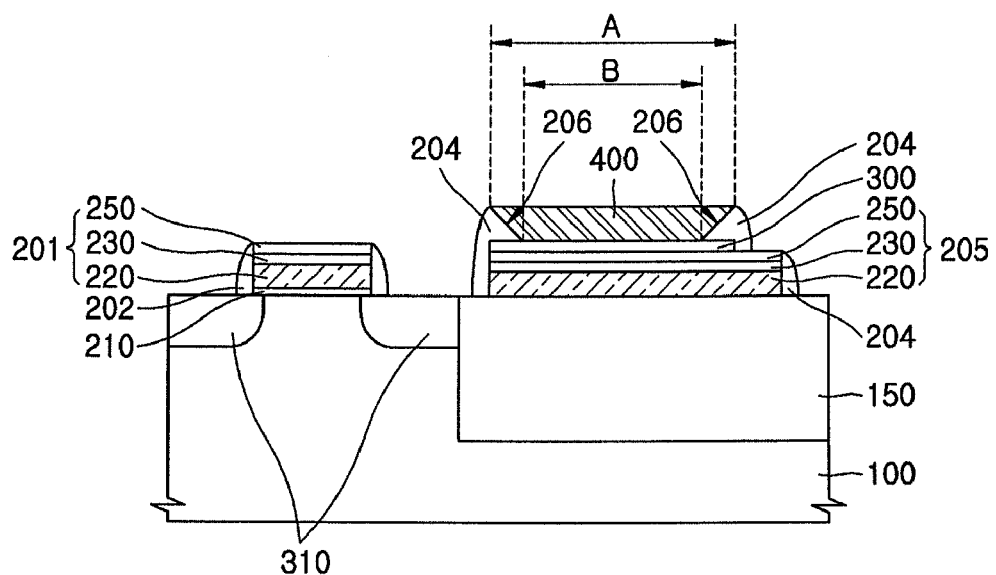

Referring to FIG. 3, a dielectric layer 300 is formed over the lower electrode pattern 205. The dielectric layer 300 is formed by depositing an oxide layer or an oxide-nitrideoxide (ONO) layer about 150 angstroms thick. Then, the upper electrode of the PIP capacitor is formed by a second polysilicon layer 400, which is selectively etched to form the upper electrode pattern.

Figure 4:
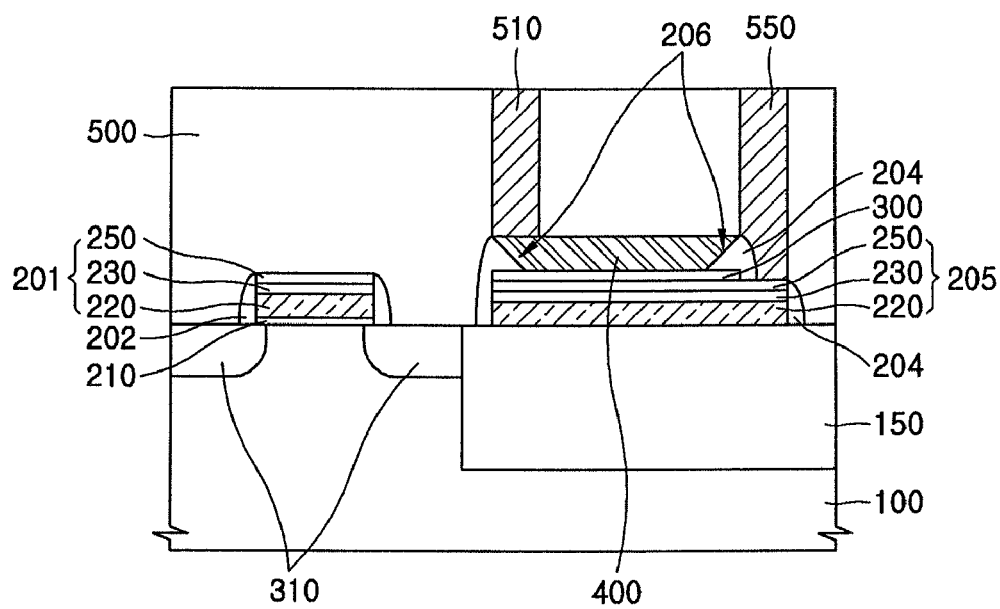

Impurity ions are then implanted to perform a pattern control process. The pattern control process is used for minute control of the formation of the capacitor. More precisely, when a polysilicon etching process is performed after impurities are implanted at an angle with a high energy, that is, inclined with respect to the plane of the overall surface of the substrate, the side wall of the patterns of the second polysilicon layer into which impurities are implanted is rapidly etched. Due to the selective etching, an effective line width B, shown in FIG. 4, is narrower than the effective line width A of the second polysilicon layer, thereby making it possible to more finely control the size of the capacitor. Here, the effective line width B can be varied in accordance with an implantation angle of the impurity implantation equipment. Therefore, a certain amount of process margin can be secured.

At this time, an additional pattern mask is not required. The mask used for patterning the second polysilicon layer 400 as the upper electrode can also be used for the ion implantation process.

CMOSFET source and drain junctions 310 are formed by ion implantation of impurities. The junction structure of a source and a drain is completed by introducing a first spacer 202 to reduce hot carriers, and implanting weak impurities and strong impurities using the first spacer 202 as a boundary.

As the first spacer 202 is introduced, a second spacer 204 is also formed over the side wall of the capacitor. The second spacer 204 has a portion 206 filling an angled recess portion of the side wall of the second polysilicon layer 400.

Referring to FIG. 4, after forming an interlayer insulating layer 500 covering the transistor and capacitor structures, a first contact 510 penetrating the interlayer insulating layer 500 and connected to the second polysilicon layer 400, and a second contact 550 connected to the lower electrode 205 are formed. The interlayer insulating layer 500 is deposited thickly to optimize a planarization process for securing a subsequent process margin. In this way, a PIP capacitor using a sandwiched polysilicon layer may be formed.

The devices may then have metal wiring layers deposited thereon.

According to embodiments described above, it is possible to control deviations in the unit capacitance with a minute change in the design of the capacitor using process parameters.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of forming a polysilicon-insulator-polysilicon (PIP) capacitor, the method comprising:
    forming a lower electrode using a first polysilicon layer over a semiconductor substrate;
    forming a dielectric layer over the lower electrode;
    forming a second polysilicon layer over the dielectric layer;
    patterning the second polysilicon layer to form an upper electrode;
    implanting impurities into a side wall of the patterned second polysilicon layer;
    selectively etching said side wall having said impurities; and
    forming a spacer over the sidewall of the patterned second polysilicon layer.

2. The method of claim 1,
    wherein the first polysilicon layer is formed using a layer which is also used for a gate of a transistor, and
    wherein the method further comprises the steps of:
    forming a tungsten silicide layer over the first polysilicon layer; and
    forming an additional polysilicon layer over the tungsten silicide layer.

3. The method of claim 2,
    wherein the additional polysilicon layer is formed to be about half of the thickness of the second polysilicon layer.

4. The method of claim 3, wherein the additional polysilicon layer functions as an anti-reflection coating layer.

5. The method of claim 1, wherein the step of implanting the impurities is selectively performed using the same mask as the mask used for the step of patterning the second polysilicon layer.

6. The method of claim 1, wherein said impurities are implanted at an angle with respect to a line perpendicular from a plane of an overall surface of said substrate.

7. The method of claim 1, wherein said impurities are implanted to control an effective line width of the patterns of the second polysilicon layer forming the upper electrode.

8. The method of claim 7, wherein the effective line width of the patterns of the second polysilicon layer forming the upper electrode is varied depending on an inclination angle at which the impurities are implanted.

9. The method according to claim 1, wherein said forming a spacer over the sidewall of the patterned second polysilicon layer is done during a process of forming a spacer over the sidewall of a transistor.

* * * * *